(12) United States Patent
Suzuki et al.

(10) Patent No.: US 11,887,911 B2
(45) Date of Patent: Jan. 30, 2024

(54) SEMICONDUCTOR STORAGE DEVICE

(71) Applicant: KIOXIA CORPORATION, Tokyo (JP)

(72) Inventors: Daigo Suzuki, Kawasaki Kanagawa (JP); Kosuke Awaga, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 819 days.

(21) Appl. No.: 17/011,755

(22) Filed: Sep. 3, 2020

(65) Prior Publication Data

US 2021/0320049 A1 Oct. 14, 2021

(30) Foreign Application Priority Data

Apr. 14, 2020 (JP) ................. 2020-072188

(51) Int. Cl.
*H01L 25/18* (2023.01)
*H01L 23/433* (2006.01)
*H05K 1/02* (2006.01)
*H05K 1/14* (2006.01)
*H05K 1/18* (2006.01)
*H05K 5/00* (2006.01)
*H05K 7/20* (2006.01)

(52) U.S. Cl.
CPC ............ *H01L 23/433* (2013.01); *H01L 25/18* (2013.01); *H05K 1/0204* (2013.01); *H05K 1/0271* (2013.01); *H05K 1/147* (2013.01); *H05K 1/189* (2013.01); *H05K 5/006* (2013.01); *H05K 7/20445* (2013.01); *H05K 1/0215* (2013.01); *H05K 1/181* (2013.01); *H05K 2201/10159* (2013.01); *H05K 2201/10189* (2013.01)

(58) Field of Classification Search
None
See application file for complete search history.

(56) References Cited

U.S. PATENT DOCUMENTS

| | | | |
|---|---|---|---|
| 6,696,755 B2 | 2/2004 | Kami et al. | |
| 7,111,674 B2* | 9/2006 | Pedoeem | ........... H05K 7/20127 174/16.3 |
| 7,863,525 B2 | 1/2011 | Miyagawa | |
| 9,980,386 B1* | 5/2018 | Li | ........... H05K 3/462 |
| 10,575,406 B1* | 2/2020 | Shen | .................... H05K 3/0017 |
| 2012/0292085 A1 | 11/2012 | Watanabe | |
| 2018/0158752 A1* | 6/2018 | Choi | ........... H01L 24/50 |
| 2020/0413528 A1* | 12/2020 | Ryu | .................... H05K 9/0024 |
| 2021/0022249 A1* | 1/2021 | Seo | ........... H05K 1/181 |

FOREIGN PATENT DOCUMENTS

| | | | | |
|---|---|---|---|---|
| CN | 107666764 B | * | 2/2021 | ............. H05K 1/024 |
| JP | 5658399 B1 | * | 1/2015 | ............. C09J 171/12 |

* cited by examiner

Primary Examiner — Michael Lebentritt
(74) Attorney, Agent, or Firm — Kim & Stewart LLP

(57) ABSTRACT

A semiconductor storage device includes a housing, an interface substrate attached to the housing, an insulating substrate in the housing, a first flexible substrate connecting the insulating substrate and the interface substrate, a first integrated circuit on a first surface of the insulating substrate, and a first heat conductor arranged on a second surface of the insulating substrate that is opposite to the first surface, and contacting a first inner surface of the housing.

20 Claims, 14 Drawing Sheets

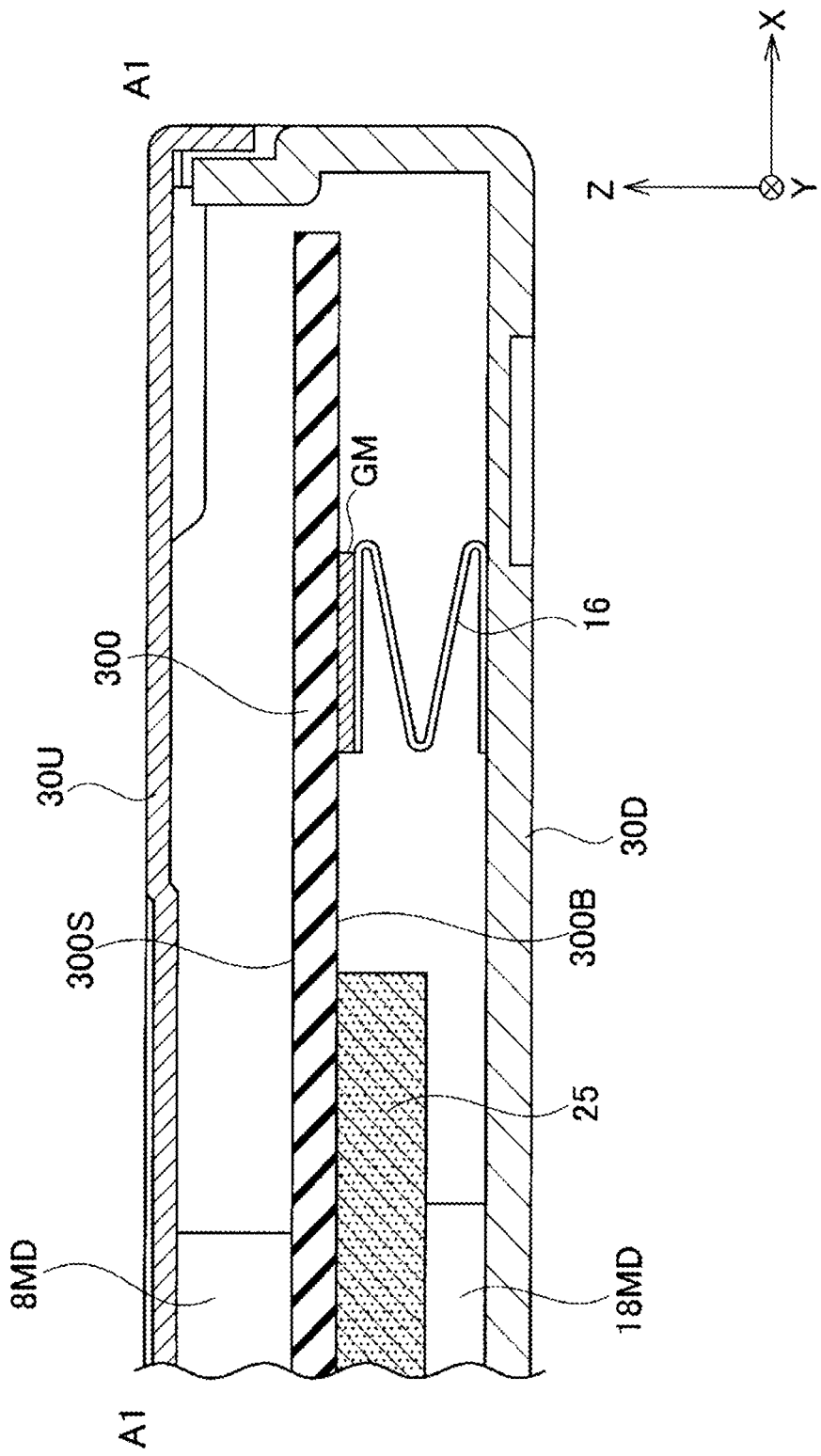

SEMICONDUCTOR STORAGE DEVICE

CROSS-REFERENCE TO RELATED APPLICATION

This application is based upon and claims the benefit of priority from Japanese Patent Application No. 2020-072188, filed Apr. 14, 2020, the entire contents of which are incorporated herein by reference.

FIELD

Embodiments described herein relate generally to a semiconductor storage device.

BACKGROUND

With an increase in a speed of semiconductor storage devices, in order to cope with a high-speed signal interface, it is necessary to use a low dielectric loss tangent material as a material for the entire printed circuit board (PCB) used for a mother board or the like on which the semiconductor storage device is to be mounted.

However, a printed circuit board made entirely of a low dielectric loss tangent material is generally expensive, so a relatively less expensive printed wiring board on which only a surface layer is made of the low dielectric loss tangent material is often used. But a printed circuit board made in such a manner may be warped due to a mismatch in linear expansion coefficients, glass transition temperatures, elastic moduli, and the like of the different materials. Furthermore, when a through hole or the like is formed in such a PCB, it is necessary to ensure adhesion of copper plating to the different materials. Generally, since a mother board is screwed directly to a rigid housing, it is necessary to relieve stresses generated inside the mother board because of environmental temperature changes or external forces.

BRIEF DESCRIPTION OF THE DRAWINGS

FIG. 7 is an enlarged cross-sectional view of a plate spring of the semiconductor storage device.

DETAILED DESCRIPTION

Figure 1:
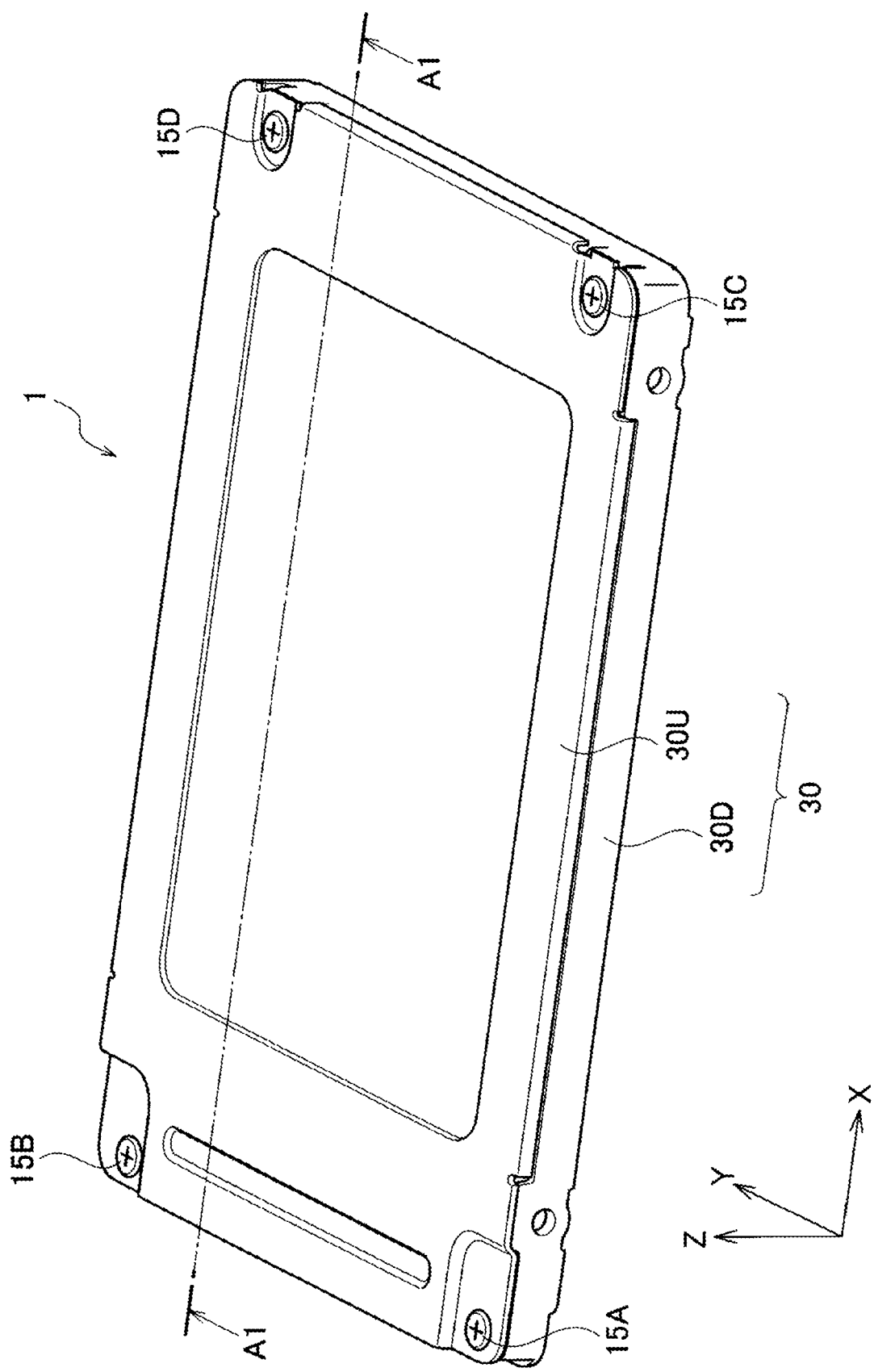
FIG. 1 is a perspective view of a semiconductor storage device according to an embodiment.

In general, according to one embodiment, a semiconductor storage device includes a housing, an interface substrate attached to the housing, an insulating substrate in the housing, a first flexible substrate connecting the insulating substrate and the interface substrate, a first integrated circuit on a first surface of the insulating substrate, and a first heat conductor arranged on a second surface of the insulating substrate that is opposite to the first surface, and contacting a first inner surface of the housing.

Next, embodiments will be described with reference to the drawings. In the description of the drawings below, the same or substantially similar elements are denoted by the same reference numerals. However, it should be noted that the drawings are schematic, and any depicted relationship between thicknesses of each component and/or a planar dimension thereof can be different from those in actuality. Therefore, specific thicknesses and dimensions should be determined in consideration of the following description. In addition, different drawings can also depict the same elements as having different dimensional relationships and proportions from each other.

In addition, the embodiments described below illustrate devices and methods embody certain technical ideas and/or concepts of the present disclosure, and these examples do not necessarily specify a material, shape, structure, arrangement, and the like of each component as might be found in an actual implementation of the corresponding technical ideas and/or concepts. That is, various modifications may be made to the described example embodiments and still be within the scope of the present disclosure.

A semiconductor storage device 1 according to one embodiment includes an insulating substrate 300, a housing 30, an I/F unit 120, a flexible substrate 200, an integrated circuit 10, and a plurality of first heat conductive sheets 8. The insulating substrate 300 is connected to the flexible substrate 200. The flexible substrate 200 is connected to the I/F unit 120.

The insulating substrate 300 can also be referred to as a mother board and/or a circuit board. Although not specifically shown, a metal foil, such as a copper foil, is disposed on a front surface and a back surface of the insulating substrate 300.

FIG. 1 is a perspective view of the semiconductor storage device 1. The semiconductor storage device 1 includes the housing 30. As shown in FIG. 1, a first direction, which is a longitudinal direction of the housing 30, is referred to as the X direction. A second direction, which is a lateral direction of the housing 30 and is orthogonal to the X direction, is referred to as the Y direction. A third direction perpendicular to an X-Y plane is referred to as the Z direction.

As shown in FIG. 1, the housing 30 includes an upper housing 30U and a lower housing 30D that can be fitted to each other. As shown in FIG. 1, the upper housing 30U and the lower housing 30D are screwed together in the Z direction by screws 15A, 15B, 15C, 15D disposed at four corners. The insulating substrate 300 is accommodated inside the housing 30. The insulating substrate 300 is not directly screwed to the housing 30 in this example.

Figure 2A:
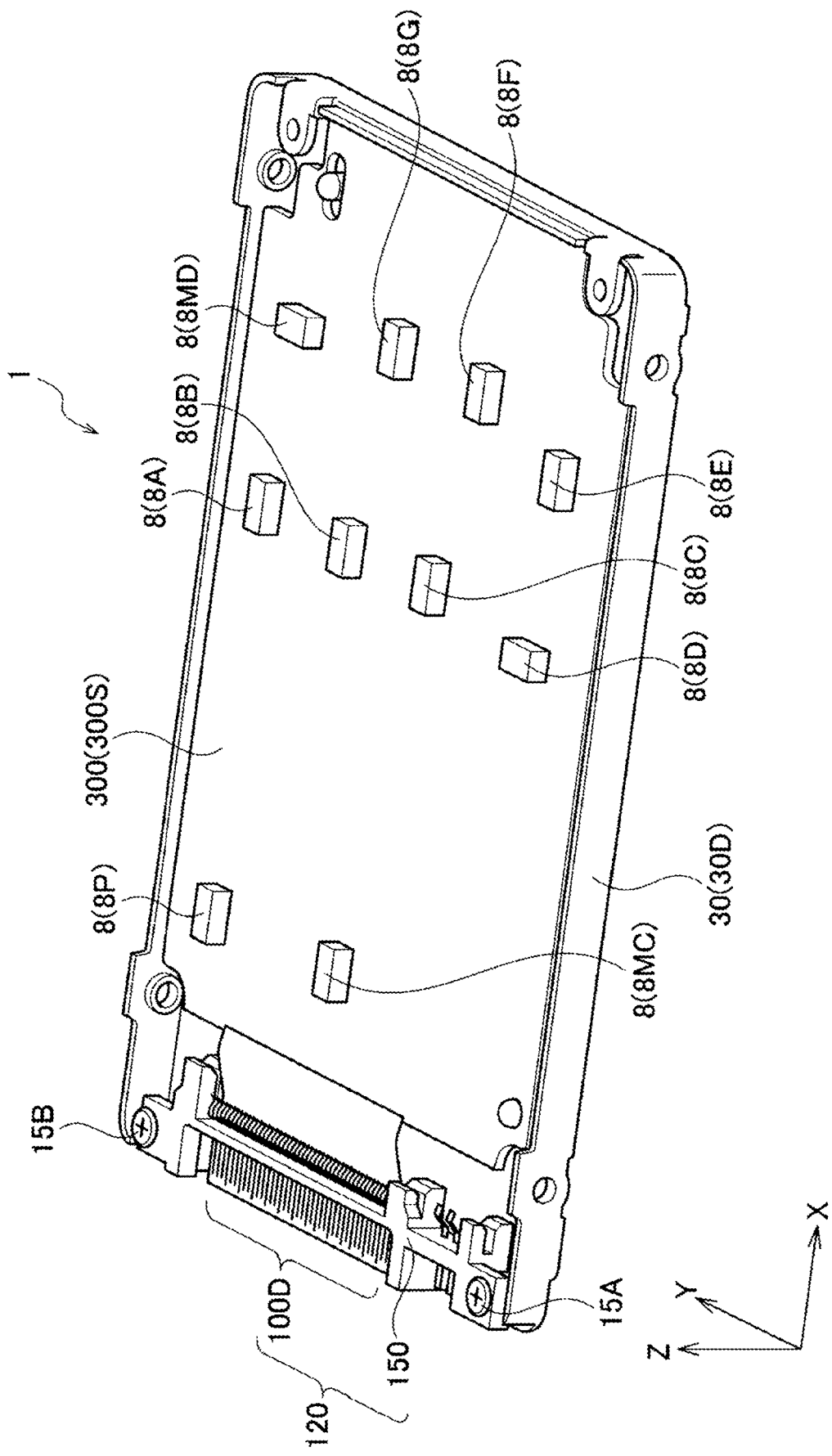
FIG. 2A is a perspective view of a first portion of the semiconductor storage device.

FIG. 2A is a perspective view showing a first portion of the semiconductor storage device 1. The first portion includes the lower housing 30D and the insulating substrate 300. The insulating substrate 300 is disposed on the lower housing 30D. A front surface of the insulating substrate 300 is labeled with the reference numeral 300S. The front surface 300S is a surface of the insulating substrate 300 on the positive side in the Z direction. The front surface 300S faces the upper housing 30U in the Z direction.

Figure 2B:
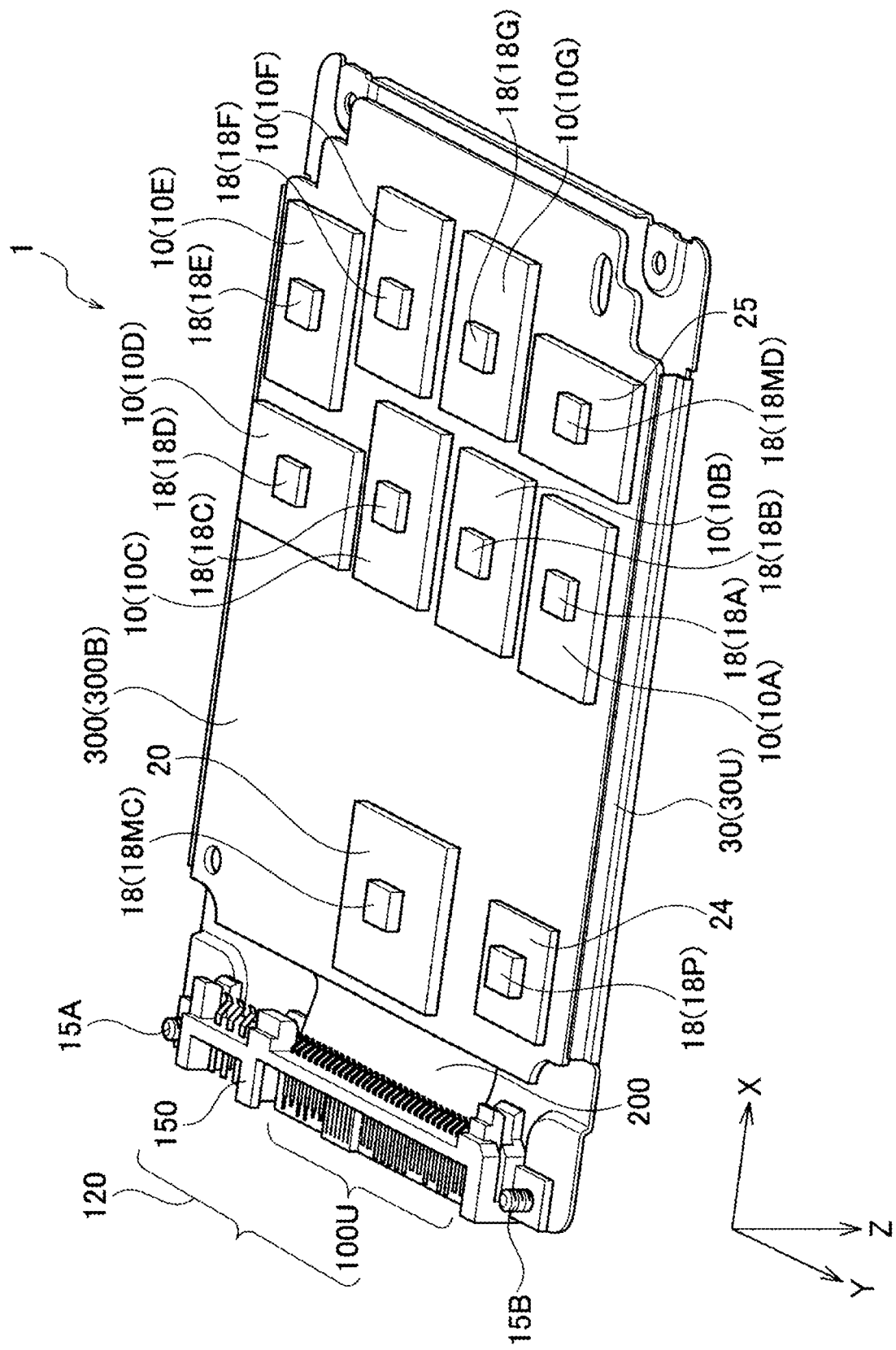
FIG. 2B is a perspective view of a second portion of the semiconductor storage device.

FIG. 2B is a perspective view of a second portion of the semiconductor storage device 1. The second portion includes the upper housing 30U and the insulating substrate 300. The insulating substrate 300 is disposed on the upper housing 30U. A back surface of the insulating substrate 300 is labeled with the reference numeral 300B. The back surface 300B is a surface of the insulating substrate 300 on the negative side in the Z direction. The back surface 300B faces the lower housing 30D in the Z direction.

The I/F unit 120 transmits a high-speed signal such as data, commands, and addresses, to an external host device 2. Examples of communication standards for such a high-speed signal I/F include serial advanced technology attachment (SATA), serial attached SCSI (SAS), PCI Express (PCIe) (registered trademarks), and the like. The I/F unit 120 includes an I/F substrate 150 and an I/F connector 100. As shown in FIGS. 2A and 2B, the I/F substrate 150 is fixed to the upper housing 30U and the lower housing 30D via the screws 15A, 15B. The I/F connector 100 is mounted on the I/F substrate 150. The I/F connector 100 can be connected to the external host device 2. The I/F connector 100 may have a two-layer structure including an I/F connector 100D and an I/F connector 100U. The I/F connector 100D is disposed on the lower housing 30D side. The I/F connector 100U is disposed on the upper housing 30U side.

The flexible substrate 200 is a substrate having flexibility. The flexible substrate 200 is made by using a low dielectric loss tangent material. The flexible substrate 200 also has good high frequency characteristics. The flexible substrate 200 is disposed between the insulating substrate 300 and the I/F substrate 150, and connects the insulating substrate 300 and the I/F substrate 150.

The integrated circuit 10 is a nonvolatile memory, a power management integrated circuit (PMIC) for power supply, a dynamic random access memory (DRAM), a memory controller, or the like. The nonvolatile memory includes a NAND flash memory, a NOR flash memory, a resistive random access memory (ReRAM), a phase-change memory (PCM), and a ferroelectric random access memory (Fe-RAM), and a magnetic tunnel junction (MTJ) variable resistance element. The integrated circuit 10 is mounted on the front surface and/or the back surface of the insulating substrate 300. In the example shown in FIG. 2B, on the back surface of the insulating substrate 300, integrated circuits such as NAND flash memories 10A to 10G, a power management integrated circuit (PMIC) 24 for power supply, a dynamic random access memory (DRAM) 25, and a memory controller 20 are mounted. The NAND flash memories 10A to 10G may be collectively referred to as NAND flash memories 10.

The plurality of first heat conductive sheets 8 dissipate heat generated by the integrated circuits. The plurality of first heat conductive sheets 8 are mounted on the front surface and/or the back surface of the insulating substrate 300. The plurality of first heat conductive sheets 8 are in contact with the upper housing 30U and/or the lower housing 30D. The insulating substrate 300 is supported on the upper housing 30U and/or the lower housing 30D via the first heat conductive sheets 8. In the example shown in FIG. 2A, the first heat conductive sheets 8A to 8G, 8P, 8MC, 8MD are disposed on the front surface of the insulating substrate 300. The first heat conductive sheets 8A to 8G, 8P, 8MC, 8MD may be collectively referred to as first heat conductive sheets 8. The first heat conductive sheets 8A to 8G are respectively disposed corresponding to the NAND flash memories 10A to 10G disposed on the back surface of the insulating substrate 300. The first heat conductive sheets 8A to 8G can respectively release heat generated by the corresponding NAND flash memories 10A to 10G towards the upper housing 30U. Similarly, the first heat conductive sheets 8P, 8MC, 8MD are respectively disposed corresponding to the PMIC 24, the memory controller 20, and the DRAM 25, which are disposed on the back surface of the insulating substrate 300. The first heat conductive sheets 8P, 8MC, 8MD can dissipate heat generated by the corresponding PMIC 24, memory controller 20 and DRAM 25 to the upper housing 30U.

The semiconductor storage device 1 may further include a second heat conductive sheet 18. The second heat conductive sheet 18 dissipates the heat generated by the integrated circuits to the housing 30. The second heat conductive sheet 18 is disposed between the integrated circuit and the upper housing 30U and/or the lower housing 30D. The second heat conductive sheet 18 is in contact with the upper housing 30U and/or the lower housing 30D. The insulating substrate 300 is supported on the upper housing 30U and/or the lower housing 30D via the second heat conductive sheet 18. In the example shown in FIG. 2B, second heat conductive sheets 18A to 18G, 18P, 18MC, 18MD are disposed on the integrated circuits mounted on the back surface of the insulating substrate 300. The second heat conductive sheets 18A to 18G, 18P, 18MC, 18MD may be collectively referred to as second heat conductive sheets 18.

According to the semiconductor storage device 1, the insulating substrate 300 is not screwed to the housing 30 (30U, 30D), but is supported in a state of being sandwiched by the heat conductive sheets. The heat conductive sheets can relieve a stress generated inside the insulating substrate 300.

Figure 3A:
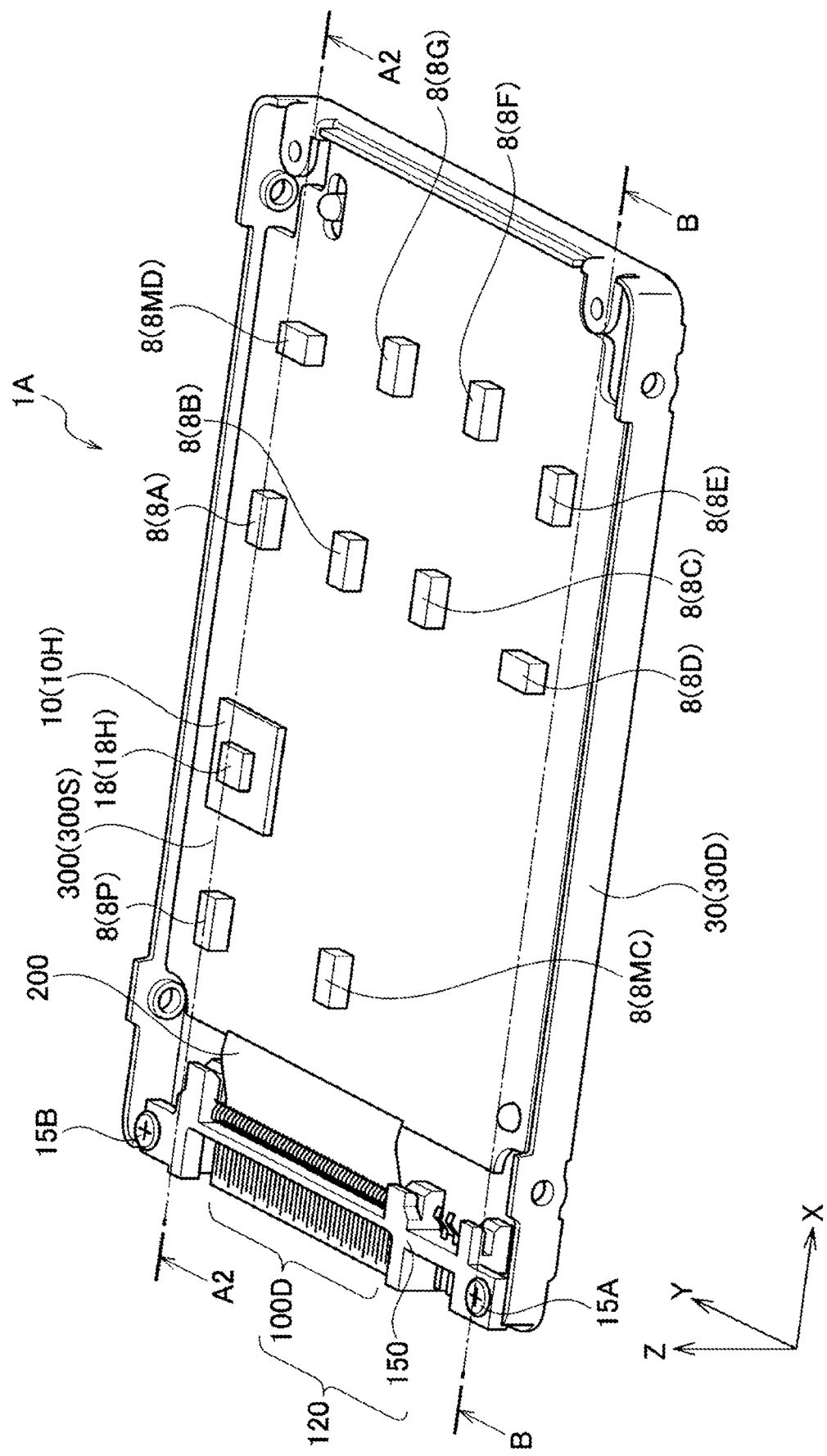
FIG. 3A is a perspective view of a first portion of a semiconductor storage device according to another embodiment.
Figure 3B:
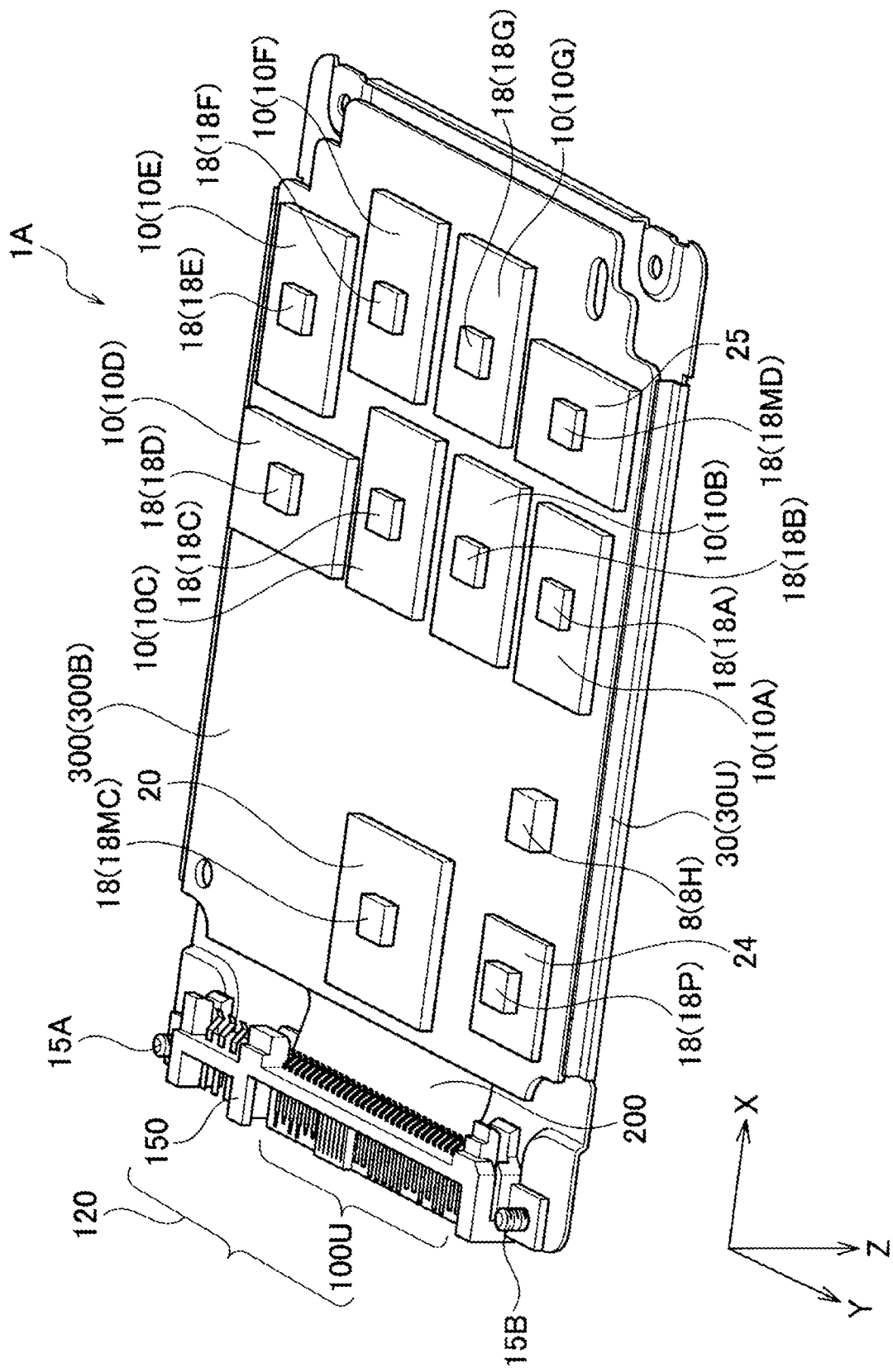
FIG. 3B is a perspective view of a second portion of the semiconductor storage device.

FIGS. 3A and 3BA are perspective views of first and second portions of a semiconductor storage device 1A according to another embodiment. The semiconductor storage device 1A includes an integrated circuit 10H on the front surface 300S of the insulating substrate 300. Further, the semiconductor storage device 1A includes a third heat conductive sheet 18H on the integrated circuit 10H. Further, the semiconductor storage device 1A includes a first heat conductive sheet 8H on the back surface 300B of the insulating substrate 300. Hereinafter, another embodiment will be described below with reference to FIGS. 3A, 3B, and 4.

The first portion includes the lower housing 30D and the insulating substrate 300. Referring to FIG. 3A, the semiconductor storage device 1A includes the integrated circuit 10H on the front surface 300S of the insulating substrate 300. Further, the semiconductor storage device 1A includes the third heat conductive sheet 18H on the integrated circuit 10H.

The second portion includes the upper housing 30U and the insulating substrate 300. Referring to FIG. 3B, the semiconductor storage device 1A includes the first heat conductive sheet 8H on the back surface 300B of the insulating substrate 300.

Figure 4:
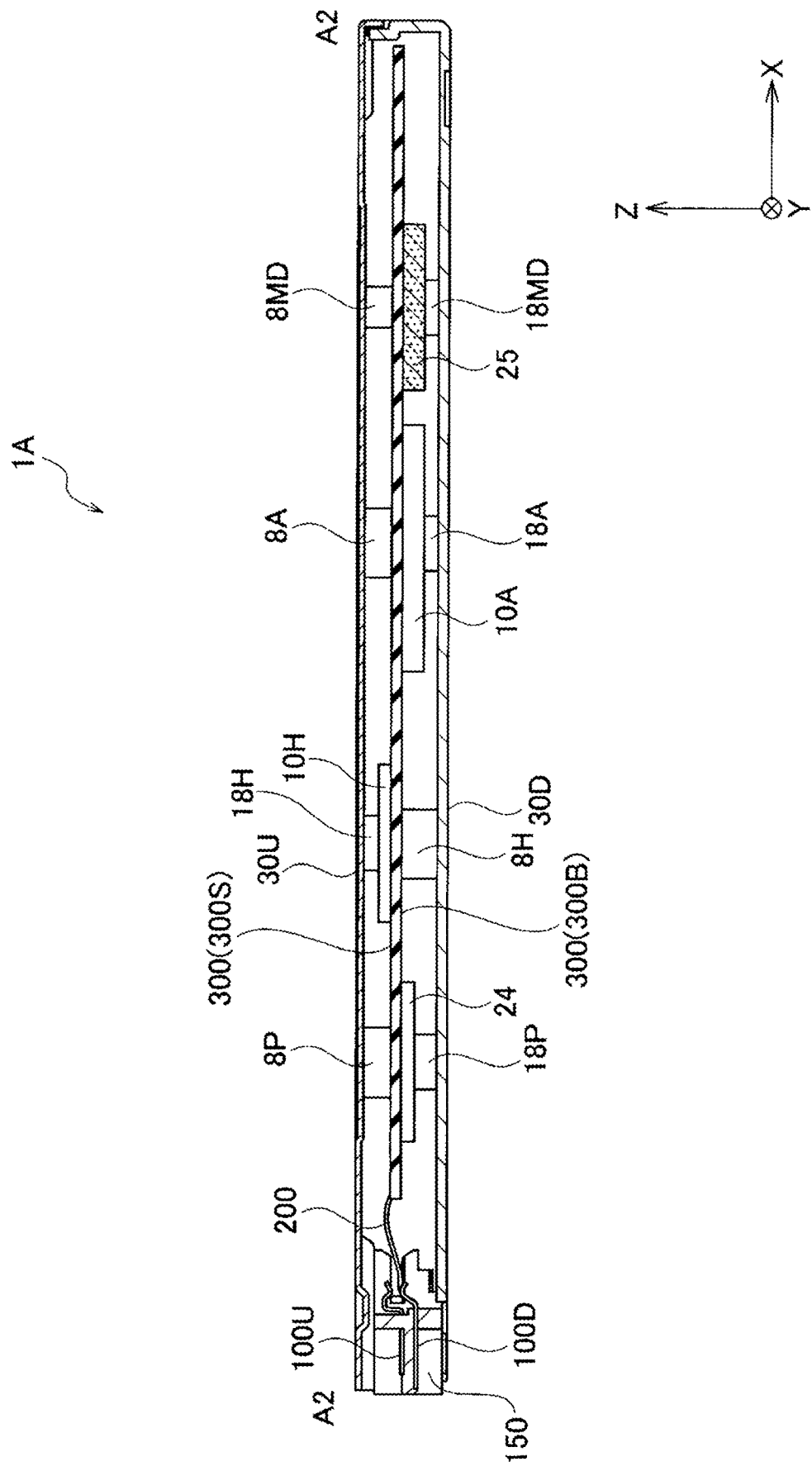
FIG. 4 is a cross-sectional view, taken along a line A2-A2 in FIG. 3A, of the semiconductor storage device.

FIG. 4 is a cross-sectional view, taken along a line A2-A2 in FIG. 3A, of the semiconductor storage device 1A. In addition, in FIG. 4, the upper housing 30U is also shown.

Referring to FIG. 4, the third heat conductive sheet 18H is disposed between the integrated circuit 10H mounted on the front surface 300S of the insulating substrate 300 and the upper housing 30U. The third heat conductive sheet 18H is in contact with the upper housing 30U. The third heat conductive sheet 18H dissipates (conducts away) heat generated by the integrated circuit 10H to the upper housing 30U. The insulating substrate 300 is supported via the upper housing 30U and the third heat conductive sheet 18H.

Referring to FIG. 4, the first heat conductive sheet 8H is disposed between the back surface 300B of the insulating substrate 300 and the lower housing 30D. The first heat conductive sheet 8H is in contact with the lower housing 30D. The first heat conductive sheet 8H conducts heat from the insulating substrate 300 to the lower housing 30D. The insulating substrate 300 is supported via the lower housing 30D and the first heat conductive sheet 8H.

Referring to FIG. 4, in the semiconductor storage device LA, the height of the first heat conductive sheet 8H measured from the back surface 300B of the insulating substrate 300 is substantially equal to the sum of the height of the integrated circuit 24 (mounted on the back surface 300B of the insulating substrate 300) and the height of the second heat conductive sheet 18P (mounted on the integrated circuit 24). The height of the first heat conductive sheet 8H is substantially equal to the sum of the height of the integrated circuit 10A (mounted on the back surface 300B of the insulating substrate 300) and the height of the second heat conductive sheet 18A (mounted on the integrated circuit 10A). Further, the height of the first heat conductive sheet 8H is substantially equal to a sum of the height of the integrated circuit 25 (mounted on the back surface 300B of the insulating substrate 300) and the height of the second heat conductive sheet 18MD (mounted on the integrated circuit 25). As a result, heat dissipation to the lower housing 30D can be equalized.

Referring to FIG. 4, in the semiconductor storage device LA, a height of each of the first heat conductive sheets 8P, 8A, 8MD from the front surface 300S of the insulating substrate 300 is substantially equal to a sum of the height of the integrated circuit 10H and the height of the third heat conductive sheet 18H. As a result, heat dissipation to the upper housing 30H can be equalized.

Figure 5:
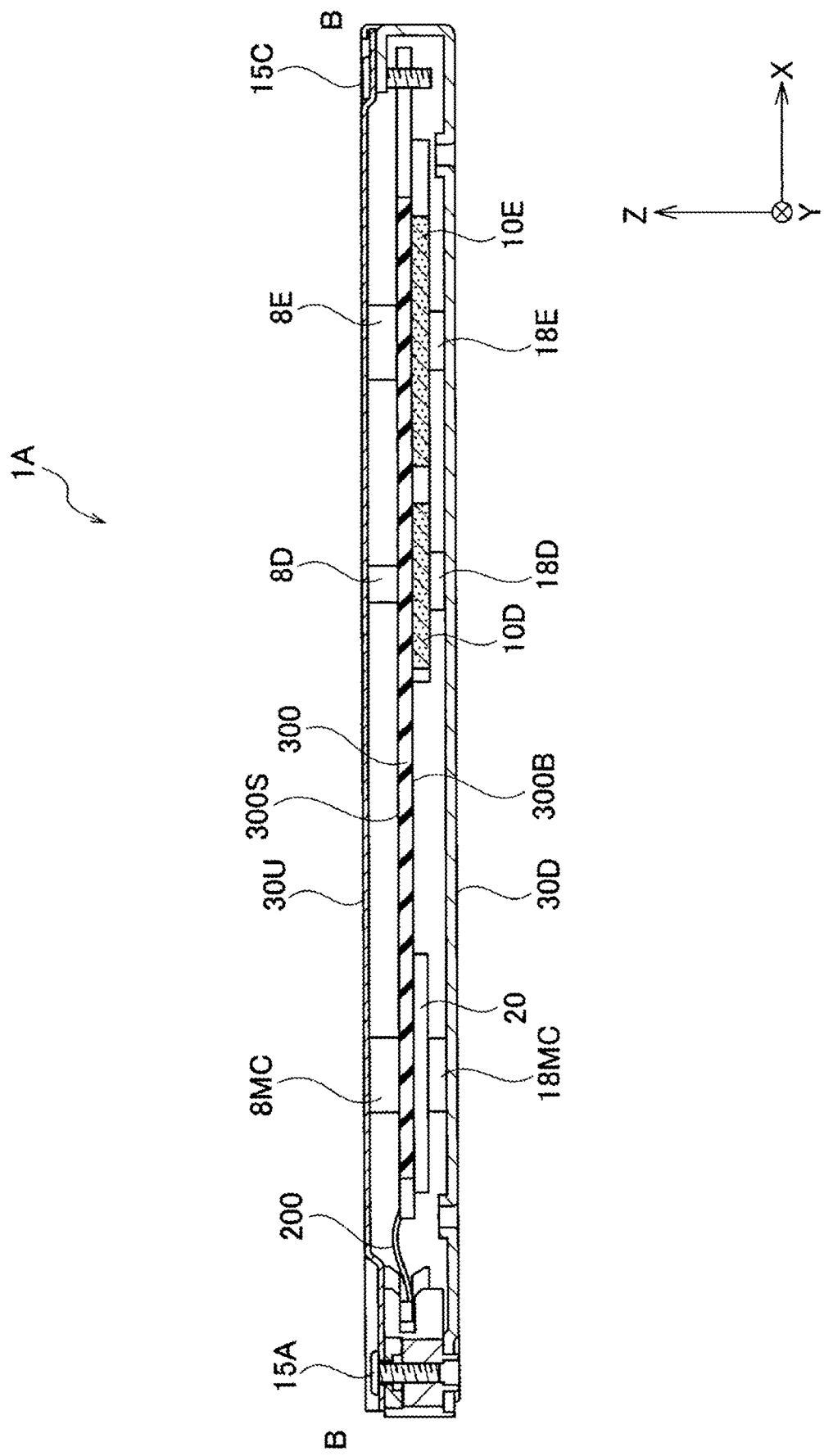
FIG. 5 is a cross-sectional view, taken along a line B-B in FIG. 3A, of the semiconductor storage device.

FIG. 5 is a cross-sectional view, taken along a line B-B in FIG. 3A, of the semiconductor storage device LA. In FIG. 5, the upper housing 30U is also shown.

Referring to FIG. 5, the first heat conductive sheets 8MC, 8D, 8E are mounted on the front surface 300S of the insulating substrate 300. The first heat conductive sheets 8MC, 8D, 8E are disposed between the insulating substrate 300 and the upper housing 30U. The first heat conductive sheet 8MC, 8D, 8E are in contact with the upper housing 30U. The insulating substrate 300 is supported via the upper housing 30U and the first heat conductive sheets 8MC, 8D, 8E.

Referring to FIG. 5, the second heat conductive sheet 18MC is disposed between the integrated circuit 20 mounted on the back surface 300B of the insulating substrate 300 and the lower housing 30D. The second heat conductive sheet 18MC is in contact with the lower housing 30D. The second heat conductive sheet 18MC dissipates heat generated by the integrated circuit 20 towards the lower housing 30D. The second heat conductive sheet 18D is disposed between the integrated circuit 10D mounted on the back surface 300B of the insulating substrate 300 and the lower housing 30D. The second heat conductive sheet 18D is in contact with the lower housing 30D. The second heat conductive sheet 18D dissipates (conducts away) heat generated by the integrated circuit 10D to the lower housing 30D. The second heat conductive sheet 18E is disposed between the integrated circuit 10E mounted on the back surface 300B of the insulating substrate 300 and the lower housing 30D. The second heat conductive sheet 18E is in contact with the lower housing 30D. The second heat conductive sheet 18E dissipates heat generated by the integrated circuit 10E to the lower housing 30D. The insulating substrate 300 is supported via the lower housing 30D and the second heat conductive sheets 18MC, 18D, 18E.

According to the semiconductor storage device LA, the insulating substrate 300 is not screwed to the housing 30 (30U, 30D), but is supported in a state of being sandwiched by the heat conductive sheets. The heat conductive sheets can relieve a stress generated inside the insulating substrate 300.

Hereinafter, a ground connection of the insulating substrate 300 in the semiconductor storage device 1 according to a first modification of the embodiment will be described. The ground configuration example is a configuration for forming a ground potential on the insulating substrate 300.

Figure 6:
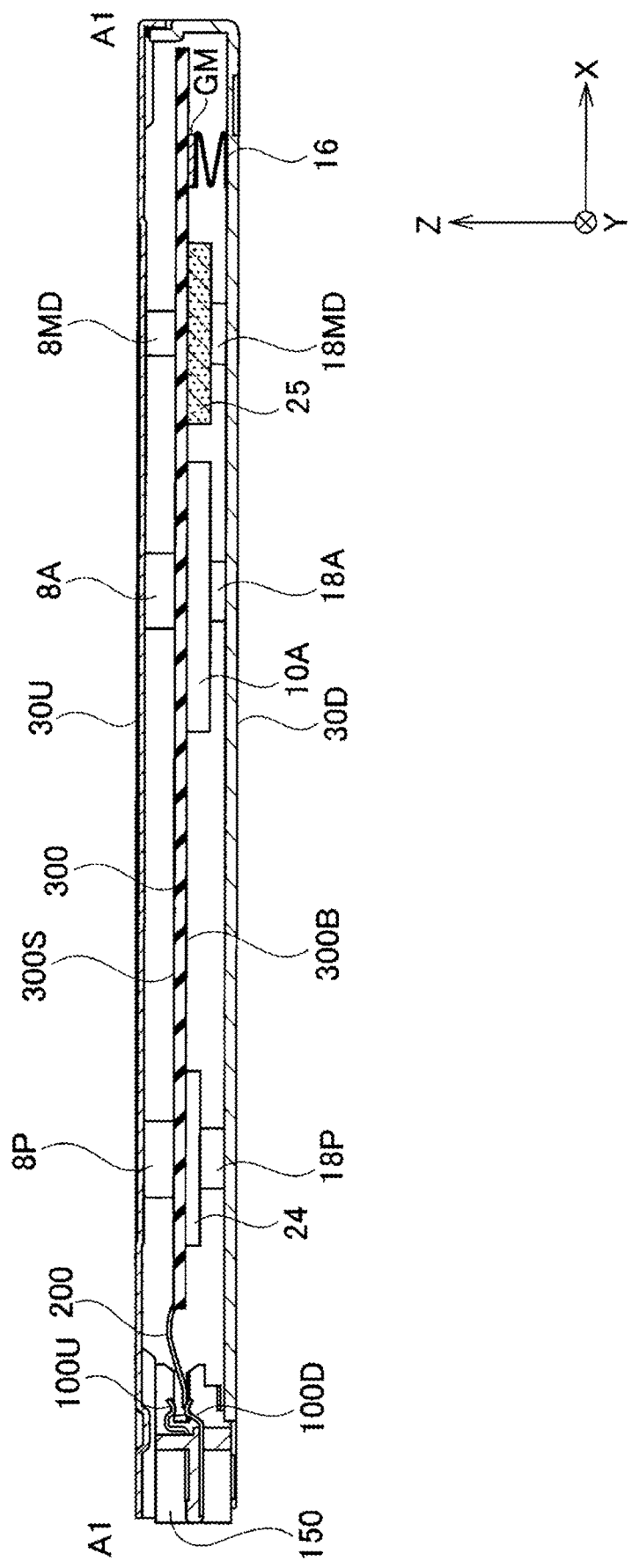
FIG. 6 is a cross-sectional view of the semiconductor storage device.

FIG. 6 is a cross-sectional view of the semiconductor storage device 1. FIG. 6 is a cross sectional view taken along a line A1-A1 in FIG. 1. The semiconductor storage device 1 includes a plate spring 16. As shown in FIG. 6, the plate spring 16 is disposed between the insulating substrate 300 and the lower housing 30D.

FIG. 7 is an enlarged cross-sectional view of the plate spring shown in FIG. 6. A ground electrode GM is disposed on the back surface 300B of the insulating substrate 300. The plate spring 16 is connected to the ground electrode GM. The insulating substrate 300 is grounded via the plate spring 16. Since the plate spring 16 has a spring structure, the plate spring 16 has an effect of relieving the stress generated inside the insulating substrate 300.

The semiconductor storage device 1 may include a grounding electrode pattern disposed on the insulating substrate 300. The grounding electrode pattern may be grounded by being connected to the upper housing 30U and/or the lower housing 30D via the plate spring 16. Further, the grounding electrode pattern may be grounded by being connected to the upper housing 30U and/or the lower housing 30D using a second flexible substrate. The second flexible substrate may have a structure similar to the flexible substrate 200 disposed on a host device 2 side, as shown in FIG. 6. That is, the second flexible substrate is arranged between the ground electrode GM and the lower housing 30D and electrically connect them. Further, the grounding electrode pattern may be grounded to the housing 30 via a connector separately provided in the housing 30.

The ground connection of the semiconductor storage device 1 described above is also applicable to the semiconductor storage device 1A.

Figure 8A:
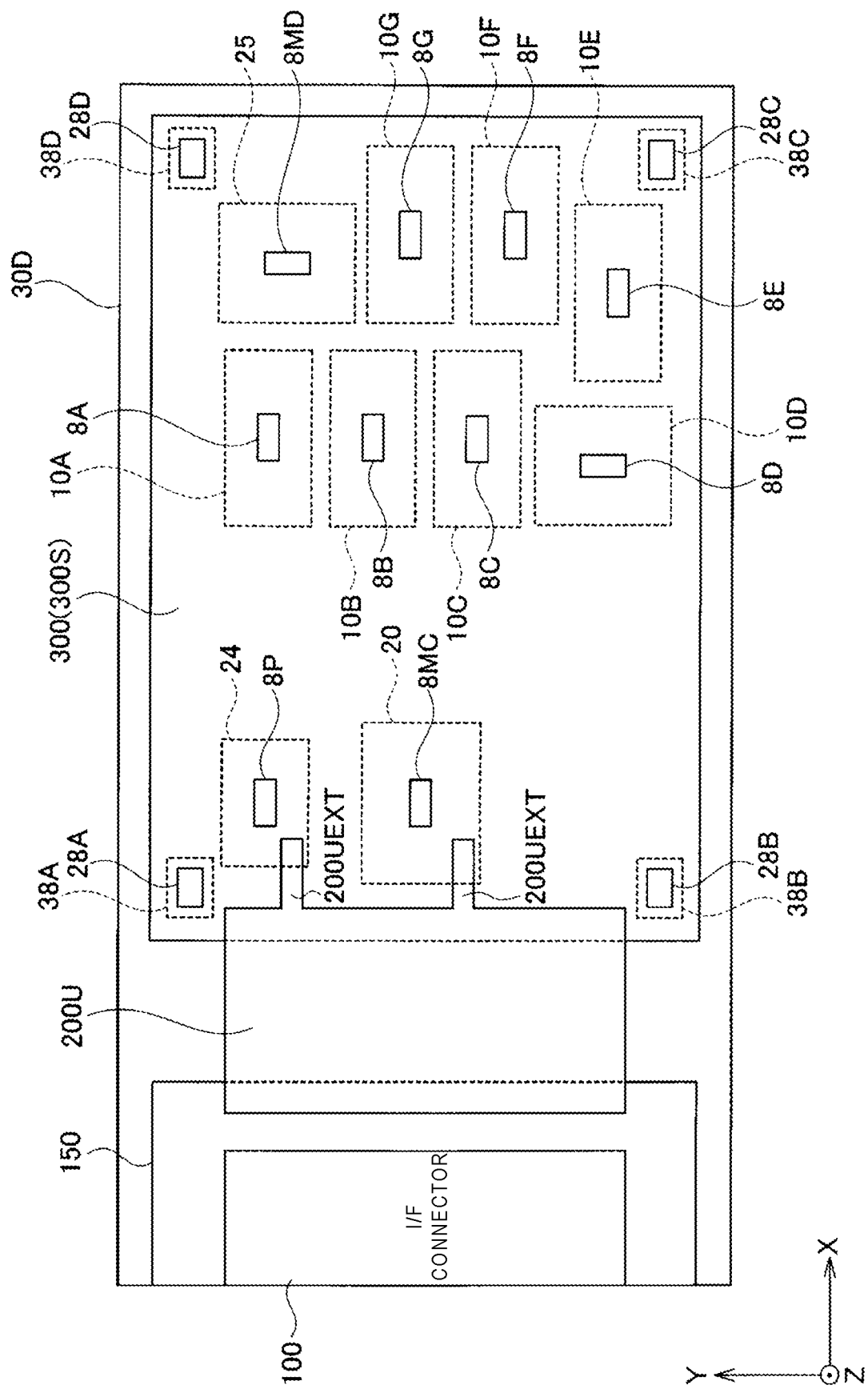
FIG. 8A is a schematic diagram of a first portion of a semiconductor storage device according to a second modification.

FIG. 8A is a schematic diagram of the first portion of the semiconductor storage device 1.

A flexible substrate 200U flexibly connects the I/F substrate 150 and the front surface 300S of the insulating substrate 300. Further, the flexible substrate 200U is connected to the I/F connector 100 inside the I/F substrate 150. In FIG. 8A, the flexible substrate 200U and parts of the flexible substrate 200UEXTs are shown. For example, each of the parts of the flexible substrate 200UEXTs can be connected to a ground wiring at a position where the ground potential needs to be supplied. The part of the flexible substrate 200UEXT extends in the X direction along the front surface 300S of the insulating substrate 300, as shown in FIG. 8A.

In FIG. 8A, the first heat conductive sheets 8A to 8G, 8P, 8MC, 8MD, and fourth heat conductive sheets 28A, 28B, 28C, 28D are disposed on the front surface 300S of the insulating substrate 300. The fourth heat conductive sheets 28A, 28B, 28C, 28D may be made of materials the same as those of the first heat conductive sheets 8A to 8G, 8P, 8MC, 8MD, or may be made of materials different therefrom. The fourth heat conductive sheets 28A, 28B, 28C, 28D are disposed between the front surface 300S of the insulating substrate 300 and the upper housing 30U. The first heat conductive sheets 8A to 8G, 8P, 8MC, 8MD and the fourth heat conductive sheets 28A, 28B, 28C, 28D have substantially the same thickness. The insulating substrate 300 is supported on the upper housing 30U by the first heat conductive sheets 8A to 8G, 8P, 8MC, 8MD and the fourth heat conductive sheets 28A, 28B, 28C, 28D. In FIG. 8A, the first heat conductive sheets 8A to 8G, 8P, 8MC, 8MD, and the fourth heat conductive sheets 28A, 28B, 28C, 28D are indicated by solid lines. Referring to FIG. 8A, the fourth heat conductive sheets 28A, 28B, 28C, 28D are disposed at the four corners of the front surface 300S of the insulating substrate 300.

Further, the NAND flash memories 10A to 10G, the PMIC 24, the memory controller 20, the DRAM 25, and fifth heat conductive sheets 38A, 38B, 38C, 38D are disposed on the back surface 300B of the insulating substrate 300. In FIG. 8A, the NAND flash memories 10A to 10G, the PMIC 24, the memory controller 20, the DRAM 25, and the fifth heat conductive sheets 38A, 38B, 38C, 38D are indicated by broken lines.

Referring to FIG. 8A, the fourth heat conductive sheets 28A, 28B, 28C, 28D, and the fifth heat conductive sheets 38A, 38B, 38C, 38D sandwich the insulating substrate 300 therebetween.

Figure 8B:
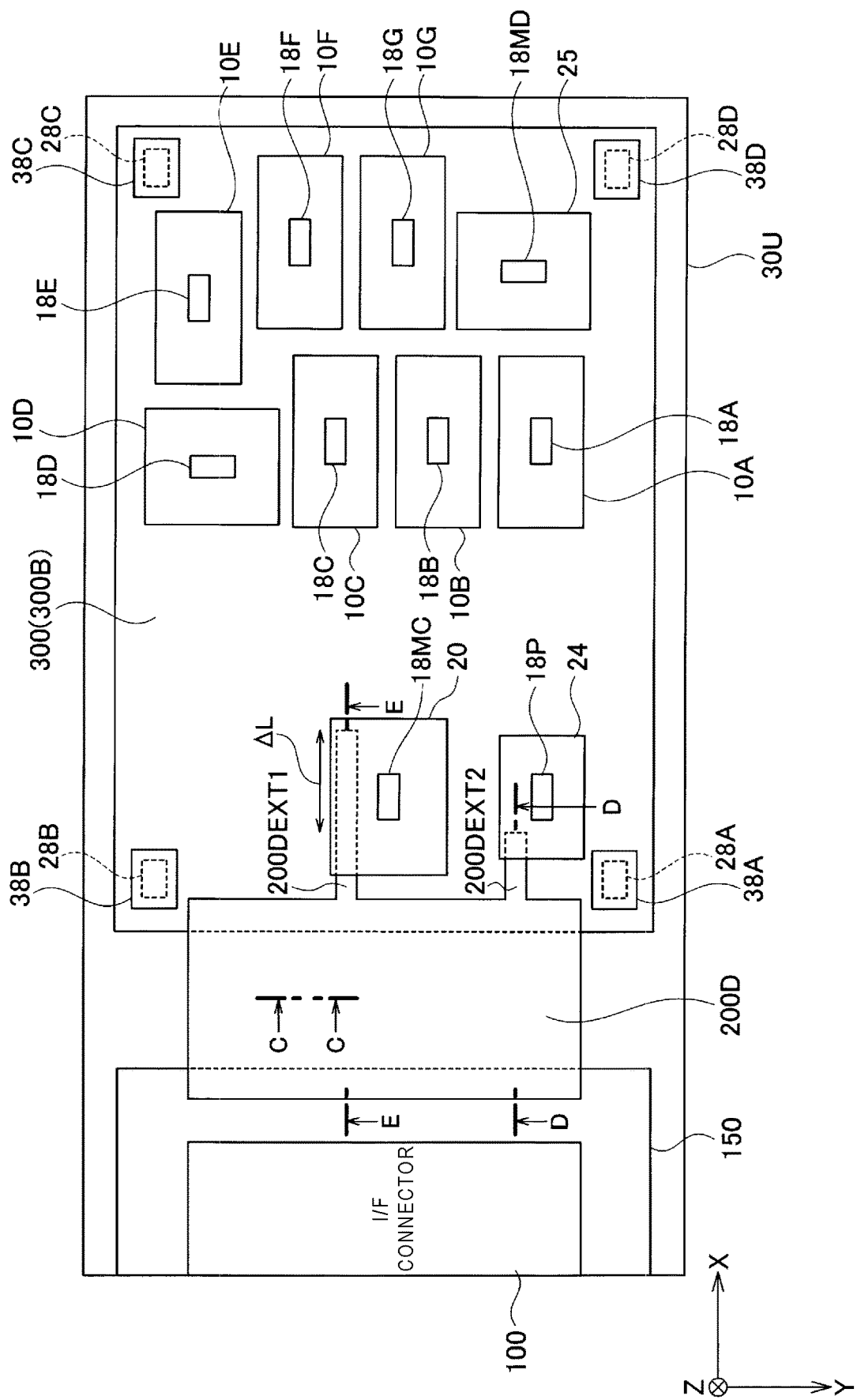
FIG. 8B is a schematic diagram of a second portion of the semiconductor storage device.

FIG. 8B is a schematic diagram of the second portion of the semiconductor storage device 1.

In FIG. 8B, a flexible substrate 200D connects the I/F substrate 150 and the back surface 300B of the insulating substrate 300. Further, the flexible substrate 200D is connected to the I/F connector 100 inside the I/F substrate 150. In FIG. 8B, the flexible substrate 200D, a part of the flexible substrate 200DEXT1, and another part of the flexible substrate 200DEXT2 are shown. For example, the part of the flexible substrate 200DEXT1 is connected to the memory controller 20. The part of the flexible substrate 200DEXT1 can convey the high-speed signal to the memory controller 20. For example, the part of the flexible substrate 200DEXT2 is connected to the PMIC24. The part of the flexible substrate 200DEXT2 can connect power supply to the PMIC24. The part of the flexible substrate 200DEXT1 extends in the X direction along the back surface 300B of the insulating substrate 300, as shown in FIG. 8B. The part of the flexible substrate 200DEXT2 also extends in the X direction along the back surface 300B of the insulating substrate 300, as shown in FIG. 8B.

Further, the NAND flash memories 10A to 10G, the second heat conductive sheets 18A to 18G, 18P, 18MC, 18MD, the PMIC 24, the memory controller 20, the DRAM 25, and the fifth heat conductive sheets 38A, 38B, 38C, 38D are disposed on the back surface 300B of the insulating substrate 300. The fifth heat conductive sheets 38A, 38B, 38C, 38D are disposed between the back surface 300B of the insulating substrate 300 and the lower housing 30D. The insulating substrate 300 is supported on the lower housing 30D by the NAND flash memories 10A to 10G, the second heat conductive sheets 18A to 18G, 18P, 18MC, 18MD, the PMIC 24, the memory controller 20, the DRAM 25, and the fifth heat conductive sheets 38A, 38B, 38C, 38D. In FIG. 8B, the NAND flash memories 10A to 10G, the second heat conductive sheets 18A to 18G, 18P, 18MC, 18MD, the PMIC 24, the memory controller 20, the DRAM 25, and the fifth heat conductive sheets 38A, 38B, 38C, 38D are indicated by solid lines. Referring to FIG. 8B, the fifth heat conductive sheets 38A, 38B, 38C, 38D are disposed at the four corners of the back surface 300B of the insulating substrate 300.

Further, the fourth heat conductive sheets 28A, 28B, 28C, 28D are disposed on the front surface 300S of the insulating substrate 300. In FIG. 8B, the fourth heat conductive sheets 28A, 28B, 28C, 28D are indicated by broken lines.

By providing the fourth heat conductive sheets 28A, 28B, 28C, 28D and the fifth heat conductive sheets 38A, 38B, 38C, 38D at the four corners of the insulating substrate 300, deformation of the four corners of the insulating substrate 300 is prevented. In addition, impact applied to the insulating substrate 300 can be absorbed by the fourth heat conductive sheets 28A, 28B, 28C, 28D and the fifth heat conductive sheets 38A, 38B, 38C, 38D.

That is, the heat conductive sheets capable of absorbing impact may be disposed at the four corners of the insulating substrate 300 to firmly connect the insulating substrate 300 and the housing 30 where deformation tends to occur. The heat conductive sheets disposed at the four corners also dissipate heat, and are disposed instead of the screws for impact vibration resistance.

The insulating substrate 300 is supported by the flexible substrate 200, the fourth heat conductive sheets 28A, 28B, 28C, 28D, and the fifth heat conductive sheets 38A, 38B, 38C, 38D. The fourth heat conductive sheets 28A, 28B, 28C, 28D are disposed between the front surface 300S of the insulating substrate 300 and the upper housing 30U. The fifth heat conductive sheets 38A, 38B, 38C, 38D are disposed between the back surface 300B of the insulating substrate 300 and the lower housing 30D. Therefore, the fourth heat conductive sheets 28A, 28B, 28C, 28D and the fifth heat conductive sheets 38A, 38B, 38C, 38D can conduct the heat away from the insulating substrate 300. In addition, impacts applied to the insulating substrate 300 are also absorbed by the fourth heat conductive sheets 28A, 28B, 28C, 28D and the fifth heat conductive sheets 38A, 38B, 38C, 38D.

The insulating substrate 300 is not screwed to the housing 30. Therefore, the fourth heat conductive sheets 28A, 28B, 28C, 28D and the fifth heat conductive sheets 38A, 38B, 38C, 38D can relieve a stress applied at the four corners of the insulating substrate 300.

Since the insulating substrate 300 is supported by the flexible substrate and the heat conductive sheets, connection reliability with the I/F unit via the flexible substrate for a long period of time can be improved.

Hereinafter, a structure of the flexible substrate 200D will be described with reference to cross-sectional views thereof.

—Two-Layer Metal Structure+Shield Structure—

The flexible substrate 200D has a two-layer structure of metal, for example. Hereinafter, the flexible substrate 200D having a structure in which a "shield structure" is combined with a "two-layer metal structure" will be described in detail. The "two-layer metal structure" is a structure made of two metal layers stacked with an insulating layer interposed therebetween. The "shield structure" is a structure that can provide an electromagnetic shield. The shield structure is formed of a metal paste layer or the like. The "shield structure" is stacked on the "two-layer metal structure" with another insulating layer interposed therebetween.

Figure 9A:
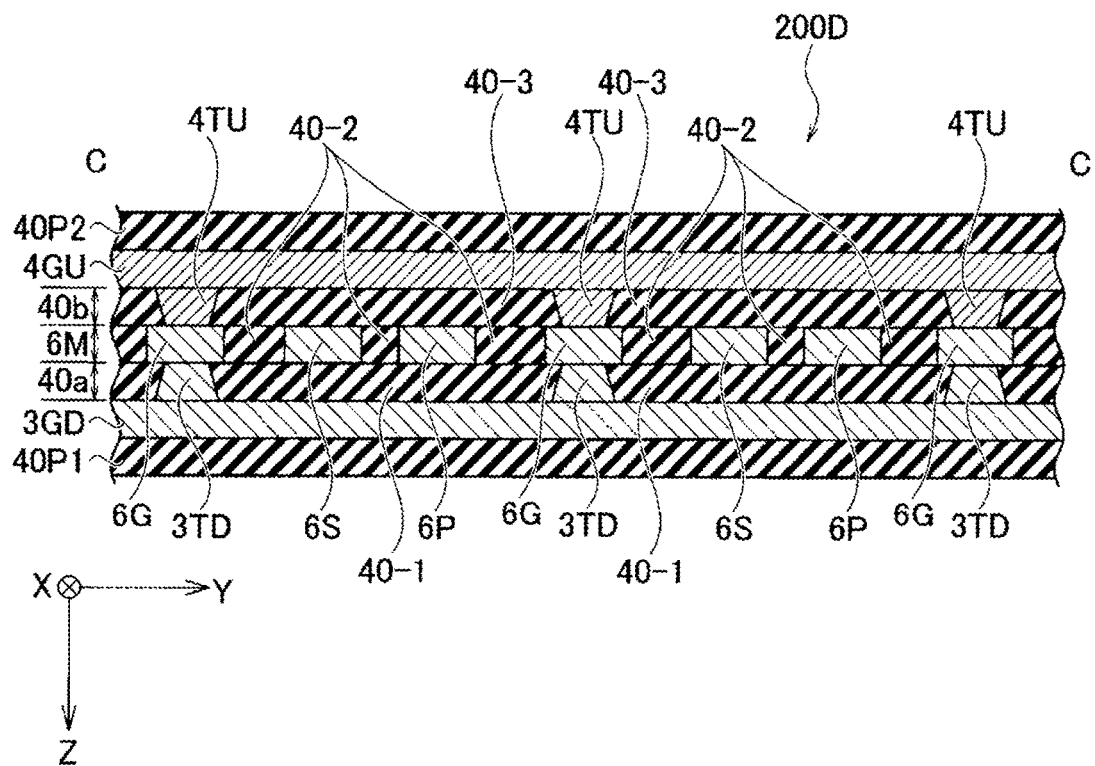
FIG. 9A is a cross-sectional view of a flexible substrate applicable to a semiconductor storage device.

FIG. 9A is a cross-sectional view of the flexible substrate 200D applicable to the semiconductor storage device 1. FIG. 9A is a structural example in which the shield structure is combined with the two-layer metal structure. Here, FIG. 9A corresponds to, for example, a cross section of the flexible substrate 200D shown in FIG. 8B taken along a line C-C in the Y direction.

As shown in FIG. 9A, the flexible substrate 200D includes a first insulating layer 40a, a second insulating layer 40b, a first metal layer 3GD, a second metal layer 6M, and a third metal layer 4GU. Further, the flexible substrate 200D may include a protective layer 40P1 made of an insulating member on an outer side of the first metal layer 3GD in the Z direction. Further, the flexible substrate 200D may include a protective layer 40P2 made of an insulating member on an outer side of the third metal layer 4GU in the Z direction. The first metal layer 3GD, the second metal layer 6M, and the third metal layer 4GU are sequentially stacked with the first and second insulating layers 40a and 40b interposed between the first metal layer 3GD and the second metal layer 6M and between the second metal layer 6M and the third metal layer 4GU.

The first metal layer 3GD electromagnetically shields the second metal layer 6M. The second metal layer 6M includes insulating members 40-2, ground wirings 6G, signal wirings 6S, and power supply wirings 6P. The ground wirings 6G, the signal wirings 6S, and the power supply wirings 6P are disposed in the second metal layer 6M, and are separated from each other via the insulating members 40-2. Further, the third metal layer 4GU electromagnetically shields the second metal layer 6M.

Further, the flexible substrate 200D has the two-layer metal structure and an electromagnetic shield structure. The two-layer metal structure includes the first metal layer 3GD, the first insulating layer 40a, and the second metal layer 6M. The first insulating layer 40a includes insulating members 40-1 and interlayer coupling conductors 3TD. The first metal layer 3GD and the ground wiring 6G of the second metal layer are electrically connected via the interlayer coupling conductor 3TD. The electromagnetic shield structure includes the second insulating layer 40b and the third metal layer 4GU. The second insulating layer 40b includes insulating members 40-3 and interlayer coupling conductors 4TU. The third metal layer 4GU and the ground wiring 6G are electrically connected via the interlayer coupling conductor 4TU.

The insulating members 40-1, 40-2, 40-3 may be made of the same material or different materials. Moreover, the first metal layer 3GD, the ground wiring 6G, the signal wiring 6S, the power supply wiring 6P, and the like may be formed using a metal foil such as a Cu foil layer. The interlayer coupling conductors 3TD, 4TU may be formed of Cu, Ti, W, solder bumps, or the like. The third metal layer 4GU and the interlayer coupling conductor 4TU may be formed, for example, by forming a metal paste layer containing metal particles, such as a silver paste layer, and performing a molding process.

—Three-Layer Metal Structure—

The flexible substrate 200D may have a three-layer metal structure. The "three-layer metal structure" is a structure made of three metal layers stacked with insulating layers interposed between the metal layers.

Figure 9B:
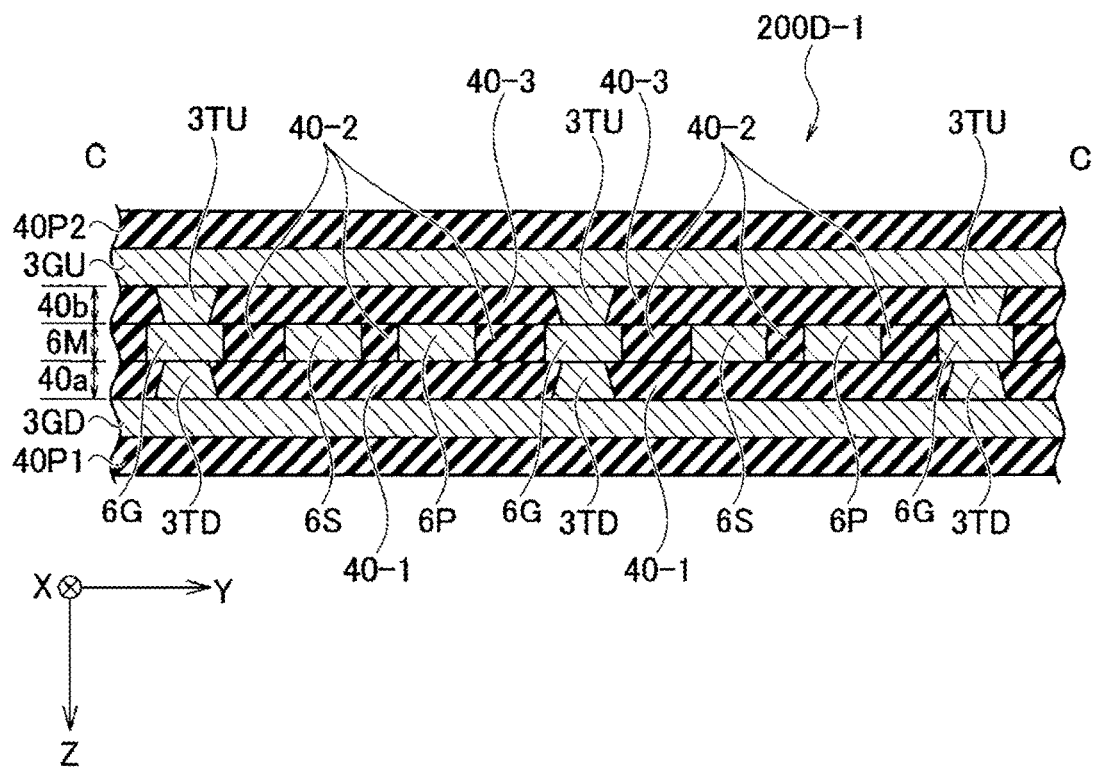
FIG. 9B is a cross-sectional view of another flexible substrate applicable to the semiconductor storage device.

FIG. 9B is a cross-sectional view of another flexible substrate 200D-1 applicable to the semiconductor storage device 1. FIG. 9B is an example of the three-layer metal structure. Here, FIG. 9B corresponds to, for example, a cross section of the flexible substrate 200D shown in FIG. 8B taken along a line C-C in the Y direction.

The flexible substrate 200D-1 includes the first metal layer 3GD, the second metal layer 6M, and a third metal layer 3GU. Further, the flexible substrate 200D-1 includes the first insulating layer 40a and the second insulating layer 40b. Further, the flexible substrate 200D-1 may include the protective layer 40P1 made of an insulating member on the outer side of the first metal layer 3GD in the Z direction. Further, the flexible substrate 200D-1 may include the protective layer 40P2 made of an insulating member on the outer side of the third metal layer 3GU in the Z direction. The first metal layer 3GD and the second metal layer 6M are stacked with the first insulating layer 40a interposed therebetween. The second metal layer 6M and the third metal layer 3GU are stacked with the second insulating layer 40b interposed therebetween.

The first metal layer 3GD electromagnetically shields the second metal layer 6M. The second metal layer 6M includes insulating members 40-2, the ground wirings 6G, the signal wirings 6S, and the power supply wirings 6P. The ground wirings 6G, the signal wirings 6S, and the power supply wirings 6P are disposed in the second metal layer 6M, and are separated from each other via the insulating members 40-2. The third metal layer 3GU electromagnetically shields the second metal layer 6M.

Further, the flexible substrate 200D-1 has the three-layer metal structure. The three-layer metal structure includes the first metal layer 3GD, the first insulating layer 40a, the second metal layer 6M, the second insulating layer 40b, and the third metal layer 3GU. The first insulating layer 40a includes the insulating members 40-1 and the interlayer coupling conductors 3TD. The first metal layer 3GD and the ground wiring 6G of the second metal layer are electrically connected via the interlayer coupling conductor 3TD. The second insulating layer 40b includes the insulating members 40-3 and interlayer coupling conductors 3TU.

The insulating members 40-1, 40-2, 40-3 may be made of the same material or different materials. Moreover, the first metal layer 3GD, the ground wiring 6G, the signal wiring 6S, the power supply wiring 6P, and the like may be formed using a metal foil such as a Cu foil layer. The interlayer coupling conductors 3TD, 3TU may be formed of Cu, Ti, W, solder bumps, or the like. The third metal layer 3GU and the interlayer coupling conductor 3TU may be formed, for example, by forming a metal paste layer containing metal particles, such as a silver paste layer, and performing a molding process.

In the semiconductor storage device 1, the flexible substrate 200D has a dielectric loss tangent value that is lower than that of the insulating substrate 300 by about one digit. The dielectric loss tangent value of the flexible substrate 200D is, for example, 0.005 or less, about 0.0025 or 0.002. As a low dielectric loss tangent material, for example, liquid crystal polymer or liquid crystal plastic (LCP) or the like may be applied. A flexible substrate with the two-layer metal structure plus the shield structure or the three-layer metal structure achieves electromagnetic shielding. Therefore, effect of external noise can be reduced. Further, noise generation can be prevented. The flexible substrate 200D can transmit, for example, a high frequency signal of about 15 GHz or higher.

(Connection Structure of Flexible Substrate and Insulating Substrate) Hereinafter, a connection structure between the flexible substrate 200 (200U, 200D) and the insulating substrate 300 will be described with reference to cross-sectional views thereof.

Figure 10A:
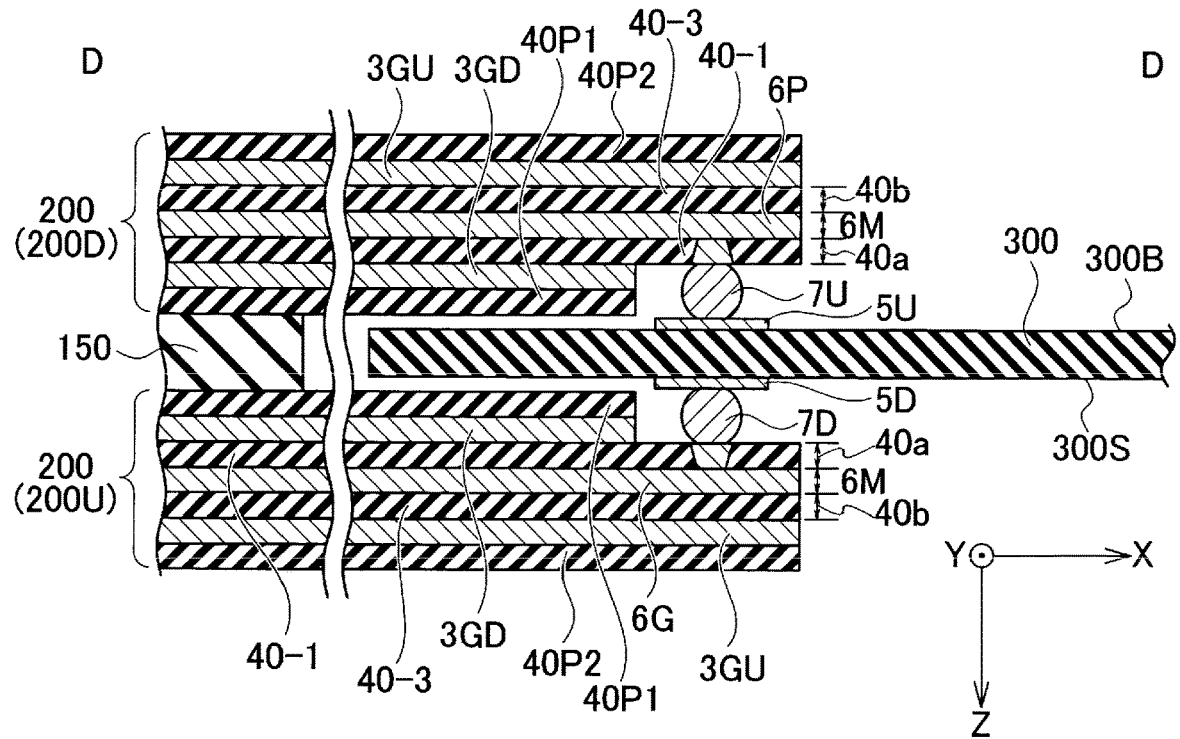
FIG. 10A is a cross-sectional view of a connection structure between a flexible substrate and an insulating substrate in the semiconductor storage device.

FIG. 10A is a cross-sectional view of a connection structure between the flexible substrate 200 and the insulating substrate 300 in the semiconductor storage device 1. Here, FIG. 10A corresponds to a vertical cross section taken along a line D-D in the X direction in FIG. 8B.

The flexible substrate 200 has the two-layer structure including the flexible substrate 200U and the flexible substrate 200D. The flexible substrate 200U and the flexible substrate 200D are connected to the I/F substrate 150. The flexible substrate 200U extends in the X direction along the front surface 300S of the insulating substrate 300. The flexible substrate 200D extends in the X direction along the back surface 300B of the insulating substrate 300.

As shown in FIG. 10A, the power supply wiring 6P of the flexible substrate 200D extends to a position where power supply is required on the back surface 300B of the insulating substrate 300. The power supply wiring 6P is connected to an electrode pattern 5U on the back surface 300B of the insulating substrate 300 via, for example, a solder bump 7U. Instead of the solder bump 7U, a silver paste, insulating particles or a thin film adhesive may be used.

The ground wiring 6G of the flexible substrate 200U extends to a position where the ground potential is required on the front surface 300S of the insulating substrate 300. The ground wiring 6G is connected to an electrode pattern 5D on the front surface 300S of the insulating substrate 300 via, for example, a solder bump 7D. Instead of the solder bump 7D, a silver paste, insulating particles or a thin film adhesive may be used.

Figure 10B:
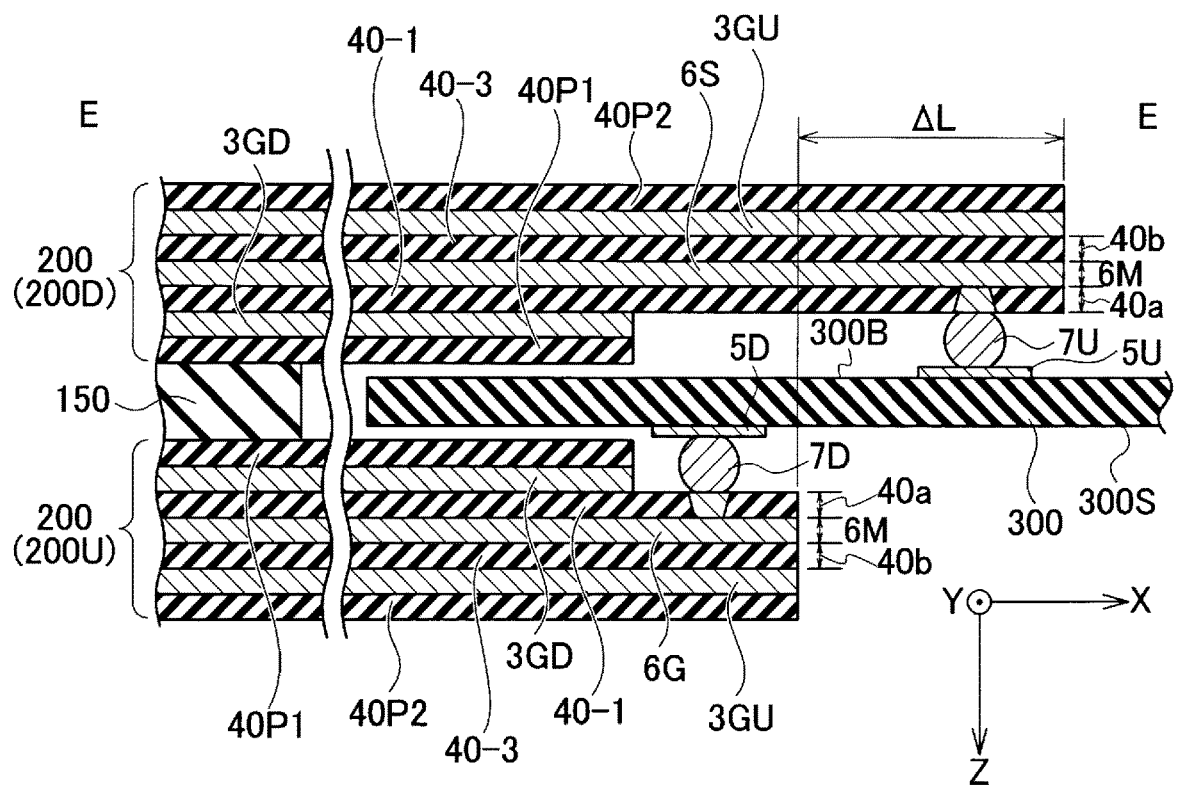
FIG. 10B is a cross-sectional view of a connection structure between the flexible substrate and the insulating substrate in the semiconductor storage device.

FIG. 10B is a cross-sectional view of another connection structure between the flexible substrate 200 and the insulating substrate 300 in the semiconductor storage device 1. Here, FIG. 10B corresponds to a vertical cross section taken along a line E-E in the X direction in FIG. 8B.

The flexible substrate 200 has the two-layer structure including the flexible substrate 200U and the flexible substrate 200D. The flexible substrate 200U and the flexible substrate 200D are connected to the I/F substrate 150. The flexible substrate 200U extends in the X direction along the front surface 300S of the insulating substrate 300. The flexible substrate 200D extends in the X direction along the back surface 300B of the insulating substrate 300.

The flexible substrate 200D can be extended to a position where signal supply is required on the back surface 300B of the insulating substrate 300. The signal wiring 6S is connected to the electrode pattern 5U on the back surface 300B of the insulating substrate 300 via, for example, the solder bump 7U. Instead of the solder bump 7U, a silver paste, insulating particles or a thin film adhesive may be used. The flexible substrate 200D may have a length in the X direction longer than that of the flexible substrate 200U. The flexible substrate 200D may be set to be longer than the flexible substrate 200U in the X direction by a length ΔL. The bonding position between the flexible substrate 200D and the electrode pattern 5U on the back surface 300B of the insulating substrate 300 is variable.

The flexible substrate 200U extends to a position where the ground potential supply is required on the front surface 300S of the insulating substrate 300. The ground wiring 6G is connected to the electrode pattern 5D on the front surface 300S of the insulating substrate 300 via, for example, the solder bump 7D. Instead of the solder bump 7D, a silver paste, insulating particles or a thin film adhesive may be used.

(Connection Relationship of Flexible Substrate, I/F Connector and Insulating Substrate) A connection relationship of the flexible substrate, the I/F connector and the insulating substrate will be described below.

The semiconductor storage device 1 has the structure in which the I/F connector 100 and the insulating substrate 300 (e.g., the mother board) are connected via the flexible substrate 200. Since the flexible substrate 200 has flexibility, the stress generated inside the insulating substrate 300 can be relieved. Further, since the flexible substrate 200 has flexibility, when the host device 2 and the I/F connector 100 are connected, the stress inside the I/F connector 100 is not directly applied to the insulating substrate 300. Further, the I/F connector 100 can be more accurately installed in the housing 30 somewhat separately from positioning precision of the insulating substrate 300 since the flexible substrate 200 has flexibility. Further, since the flexible substrate 200 has flexibility, accuracy in positioning of the I/F connector 100 can be increased independently of the positioning accuracy of the insulating substrate 300.

(Length Adjustment of Flexible Substrate) Hereinafter, length adjustment of the flexible substrate will be described.

A length of the flexible substrate 200 can be adjusted. Further, the flexible substrate 200 can be disposed on the front surface side and/or the back surface side of the insulating substrate 300. Then, the signal wiring, the power supply wiring, and the ground wiring can be disposed at a tip end portion of the flexible substrate 200. That is, lengths of the signal wiring, the power supply wiring, and the ground wiring of the flexible substrate 200 and the coupling position with the insulating substrate 300 can be adjusted.

Merit of adjusting the length of the flexible substrate 200 is that the flexible substrate 200 can be used as a wiring having good high frequency characteristics instead of the insulating substrate 300.

The flexible substrate 200 has high frequency performance relatively better than that of the insulating substrate 300. A dielectric loss tangent value of the insulating substrate 300 is higher than a dielectric loss tangent value of the flexible substrate 200 by about one digit. As the dielectric loss tangent value increases, a loss increases. Therefore, it is effective to adjust the length of the flexible substrate 200 to extend the wiring for which high frequency performance is desired to be kept in consideration of the arrangement of the integrated circuits and the heat conductive sheets on the insulating substrate 300 side.

(Supporting Mechanism of Semiconductor Storage Device) A supporting mechanism of the semiconductor storage device 1 will be described below.

In the semiconductor storage device 1, the insulating substrate 300 is supported by the heat conductive sheets. The heat conductive sheet has a low elastic modulus such as rubber. The heat conductive sheet may be formed of a silicone resin, or the like. The heat conductive sheet may be cut into pieces and attached. In some examples, only some of the describe heat conductive sheets may be incorporated for purposes of heat dissipation and some components may be provided primarily to function in absorbing impacts rather than primarily for heat dissipation.

(Configuration of System of Semiconductor Storage Device) Next, a block diagram of the semiconductor storage device 1 will be described.

Figure 11:
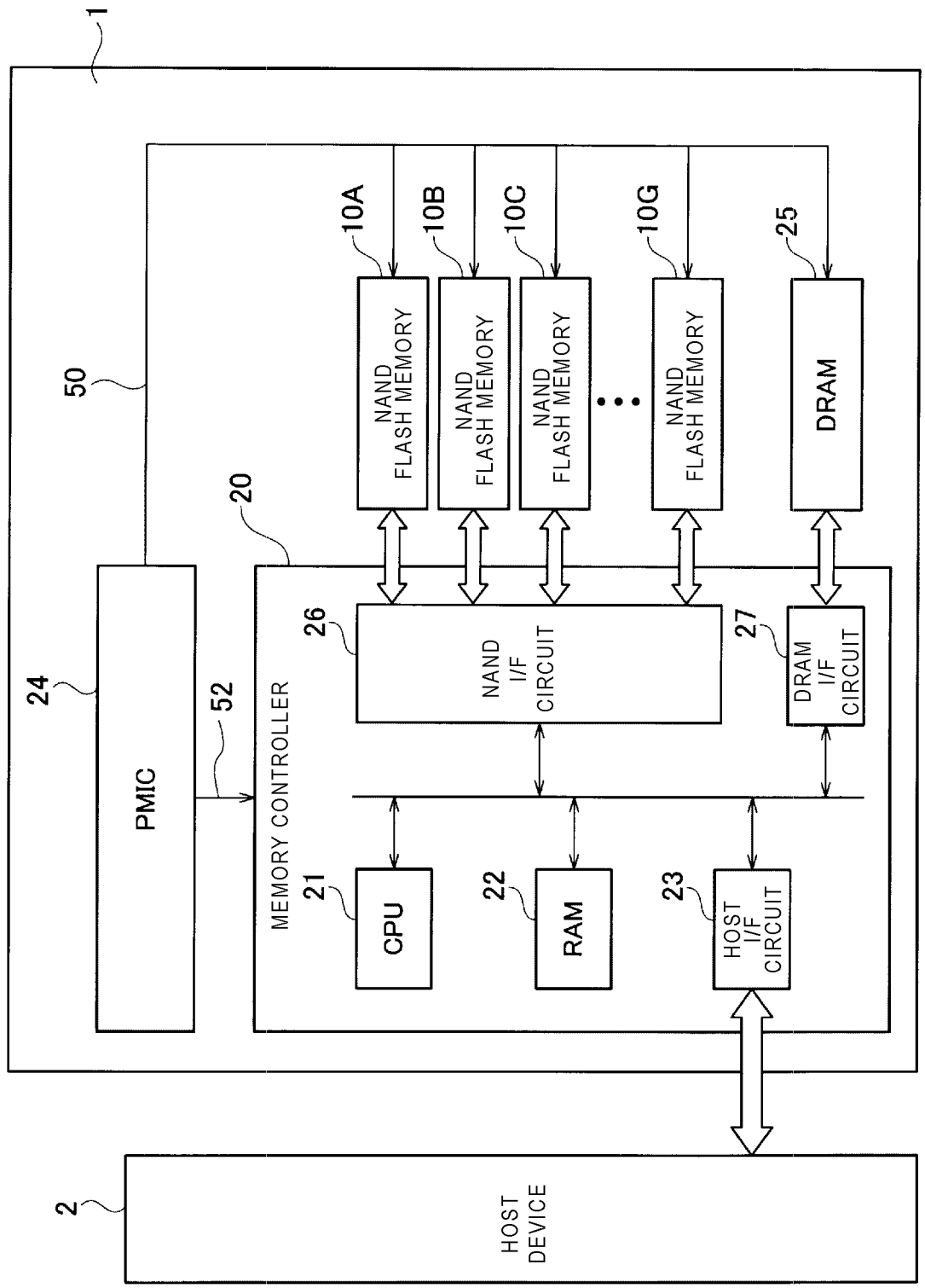
FIG. 11 is a block diagram of the semiconductor storage device.

FIG. 11 is the block diagram of the semiconductor storage device 1. For example, the semiconductor storage device 1 is an SSD. As shown in FIG. 11, the semiconductor storage device 1 includes the NAND flash memories 10A to 10G, the DRAM 25, the memory controller 20, and the PMIC 24.

The NAND flash memories 10A to 10G are nonvolatile memories capable of storing data in a nonvolatile manner, and each of the NAND flash memories can operate independently. The number of NAND flash memories 10 is not particularly limited, and may be designed to any number. The NAND flash memories 10A to 10G and the memory controller 20 are connected via a plurality of channels.

The DRAM 25 is a volatile memory that can temporarily store data. The number of the volatile memory provided in the semiconductor storage device 1 may be designed to be any number. Further, the volatile memory is not limited to the DRAM. For example, a static random access memory (SRAM) or the like may be used as the volatile memory.

The memory controller 20 can perform various operations while reading and writing data from and to the NAND flash memory 10 and the DRAM 25. Further, the memory controller 20 can execute an operation based on a command from the external host device 2 and an operation not dependent on the command from the host device 2.

The PMIC 24 supplies necessary power supply to the memory controller 20 via a power supply line 52. The PMIC supplies necessary power supply to the NAND flash memories 10A to 10G and the DRAM 25 via a power supply line 50. The PMIC 24 includes, for example, a DC/DC converter, a low drop output (LDO), a switching regulator and the like.

As shown in FIG. 11, the memory controller 20 includes, for example, a central processing unit (CPU) 21, a built-in memory 22, such as a random access memory (RAM), a host I/F circuit 23, an NAND I/F circuit 26, and a DRAM I/F circuit 27. The configuration of the memory controller 20 is merely an example, and the disclosure is not limited thereto.

The CPU 21 controls operations of the overall memory controller 20. For example, the CPU 21 issues a read command in response to a read command received from the host device 2, and transmits the issued command to the NAND I/F circuit 26.

The built-in memory 22 is a memory area used as a work area of the CPU 21. For example, in the built-in memory 22, parameters for managing the NAND flash memory 10 and various management tables are expanded. For example, the built-in memory 22 provides a command queue of commands received from the host device 2. Further, the built-in memory 22 stores an address conversion table for converting a logical address associated with data stored in a memory block BLK into a physical block address (PBA) of the memory block BLK. The address conversion table is stored in, for example, the NAND flash memory 10, is read when the semiconductor storage device 1 starts up, and is expanded in the built-in memory 22. As the built-in memory 22, for example, a volatile memory such as an SRAM is used.

The host I/F circuit 23 is connected to the host device 2, and controls communication between the semiconductor storage device 1 and the host device 2. For example, the host I/F circuit 23 controls transmission of the data, the commands, and the addresses between the semiconductor storage device 1 and the host device 2. The host I/F circuit 23 supports a communication I/F standard such as SATA, SAS, and PCIe (registered trademarks). That is, an example of the host device 2 to be connected to the semiconductor storage device 1 includes a computer including an I/F such as SATA, SAS, and PCIe.

The NAND I/F circuit 26 is connected to the NAND flash memories 10A to 10G, and controls communication between the memory controller 20 and the NAND flash memory 10. The NAND I/F circuit 26 conforms to a NAND I/F standard.

The DRAM I/F circuit 27 is connected to the DRAM 25, and controls communication between the memory controller 20 and the DRAM 25. The DRAM I/F circuit 27 conforms to a DRAM I/F standard. A configuration of the DRAM I/F circuit 27 is not limited to the disclosure, and can be changed based on types of the volatile memory.

The semiconductor storage device 1 has an I/F coping with high-speed signals. Further, in the semiconductor storage device 1, the stress inside the I/F connector is not directly applied to the insulating substrate when the I/F connector is connected to the external host device. Therefore, the semiconductor storage device 1 achieves high operation reliability.

With the semiconductor storage device 1, an SSD in which the I/F connector is accurately positioned with respect to the housing can be provided.

In the SSD provided by the semiconductor storage device 1, the reliability of connection for a long period is improved even when a temperature changes. Further, resistance to the impact applied from outside can be improved.

Further, in the SSD provided by the semiconductor storage device 1, the number of screws to be fixed is reduced.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a housing;
   an interface substrate attached to the housing;
   an insulating substrate in the housing;
   a first flexible substrate connecting the insulating substrate and the interface substrate;
   a first integrated circuit on a first surface of the insulating substrate; and
   a first heat conductor arranged on a second surface of the insulating substrate that is opposite to the first surface, and contacting a first inner surface of the housing.

2. The semiconductor storage device according to claim 1, further comprising:
   a second heat conductor on the first integrated circuit and contacting a second inner surface of the housing that faces the first inner surface.

3. The semiconductor storage device according to claim 2, wherein a height of the first heat conductor in a thickness direction of the insulating substrate is substantially equal to a sum of a height of the first integrated circuit and a height of the second heat conductor in the thickness direction.

4. The semiconductor storage device according to claim 1, further comprising:
   a second heat conductor on the first integrated circuit, wherein
   the housing includes a lower housing and an upper housing, and the second heat conductor contacts the lower housing so that heat is conducted from the first integrated circuit to the lower housing.

5. The semiconductor storage device according to claim 1, further comprising:
a second integrated circuit on the second surface of the insulating substrate; and
a third heat conductor on the second integrated circuit, wherein
the housing includes a lower housing and an upper housing, and
the third heat conductor contacts the upper housing so that heat is conducted from the second integrated circuit to the upper housing.

6. The semiconductor storage device according to claim 5, wherein a height of the first heat conductor in a thickness direction of the insulating substrate is substantially equal to a sum of a height of the first integrated circuit and a height of the third heat conductor in the thickness direction.

7. The semiconductor storage device according to claim 1, wherein
the first flexible substrate includes a first metal layer, a first insulating layer, a second metal layer, a second insulating layer, and a third metal layer that are stacked in this order,
the second metal layer includes a ground wiring, a signal wiring, and a power supply wiring that are separated from each other via an insulating member, and
the first and third metal layers are connected to the ground wiring so that the signal wiring and the power supply wiring are electromagnetically shielded.

8. The semiconductor storage device according to claim 7, wherein the first metal layer includes a metal paste layer.

9. The semiconductor storage device according to claim 7, wherein each of the first and second insulating layers has a dielectric loss tangent value that is lower than the insulating substrate by one digit.

10. The semiconductor storage device according to claim 7, further comprising:
an electrode pattern arranged on the insulating substrate and connected to the signal wiring.

11. The semiconductor storage device according to claim 10, wherein the signal wiring and the electrode pattern are connected via either a solder bump or a silver paste layer.

12. The semiconductor storage device according to claim 11, wherein a bonding position between the first flexible substrate and the electrode pattern of the insulating substrate is variable.

13. The semiconductor storage device according to claim 11, further comprising:
a second flexible substrate; and
a grounding electrode pattern disposed on the insulating substrate and connected to the housing via the second flexible substrate.

14. The semiconductor storage device according to claim 7, wherein the integrated circuit is a memory controller connected to the signal wiring of the first flexible substrate.

15. The semiconductor storage device according to claim 7, wherein the integrated circuit is a power management integrated circuit connected to the power supply wiring of the first flexible substrate.

16. The semiconductor storage device according to claim 1, further comprising:
fourth heat conductors disposed at four corners of the second surface of the insulating substrate and contacting the first inner surface of the housing.

17. The semiconductor storage device according to claim 16, further comprising:
fifth heat conductors disposed at four corners of the first surface of the insulating substrate and contacting a second inner surface of the housing that faces the first inner surface.

18. The semiconductor storage device according to claim 17, wherein the fourth heat conductors and the fifth heat conductors overlap when viewed from the first inner surface of the housing.

19. The semiconductor storage device according to claim 1, further comprising:
a plate spring; and
a grounding electrode pattern disposed on the insulating substrate and connected to the housing via the plate spring.

20. The semiconductor storage device according to claim 1, wherein the integrated circuit is one of a power management integrated circuit, a NAND flash memory, a dynamic random access memory, or a memory controller.

* * * * *